DISK TYPE TURRET TUNER

Filed Nov. 19, 1956

INVENTOR.
ROBERT J. ROWLEY
BY
Moody and Harsha
ATTORNEYS

United States Patent Office 3,064,216
Patented Nov. 13, 1962

3,064,216
DISK TYPE TURRET TUNER

Robert J. Rowley, Cedar Rapids, Iowa, assignor to Collins Radio Company, Cedar Rapids, Iowa, a corporation of Iowa Filed Nov. 19, 1956, Ser. No. 623,076
5 Claims. (Cl. 334—49)

This invention relates to resonant frequency tuners and more particularly to such tuners of the so-called turret type.

As communications equipments become more compact it necessarily reduces the size of any tuning element contained therein. As communications equipments become smaller, the trend is also to make them serve a great many frequencies. The result is that tuning elements in modern-day equipments must not only be small, but must additionally provide for an increasing number of frequencies.

This invention is a novel tuner which is small in size and which provides a maximum number of tuned circuits for its size. This invention is a novel turret-type tuner where the requisite tuned circuits are arranged around the turret base so that the circuits may be rotated to make contact with external contacts including a common contact.

It is an object of this invention ot provide a tuning device which is small in size and which is also economical to construct. It is a further object of this invention to provide a device which furnishes a maximum number of tuned circuits in a small, compact unit. It is a still further object of this invention to provide a turret-type tuner utilizing economical components which may be readily and simply mass-produced.

These and other objects of this invention will become apparent when the following description is read in conjunction with the drawing in which.

Figure 1:
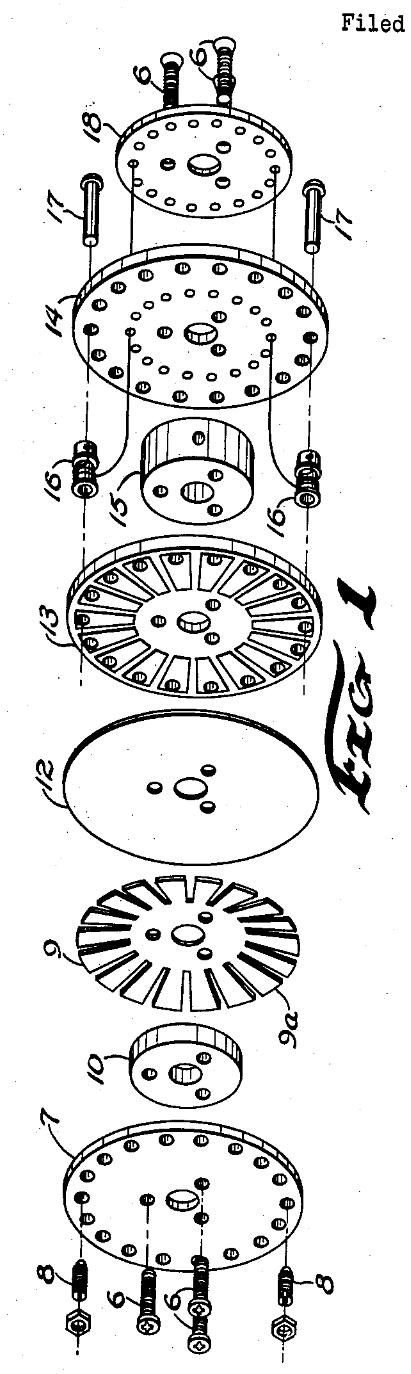
FIGURE 1 is an exploded view of one embodiment of this invention.

Referring now to FIGURE 1, the individual structural elements of this invention are clearly set forth. The individual structural members of the turret tuner of this invention are held together by the screw members 6. As shown in the assembled view, FIGURE 2, these screw members are completely joined when the tuner is assembled and thus firmly hold the structural elements of this invention in position. Other means of assembling and holding the structural members of this invention may obviously be used rather than the screw members 6. The plate 7 is an alignment plate which provides alignment between the individual adjustment screws 8 and the corresponding condenser fins 9a on the common condenser plate 9. Alignment plate 7 and the common condenser plate 9 are separated by the separation block 10. This block 10 may be made from any conductive material which possesses the necesasry structural strength. The common condenser plate 9 should be made of silver plated beryllium copper or some other good conductive spring material, while the alignment plate 7 will be made of any metallic material.

Figure 2:
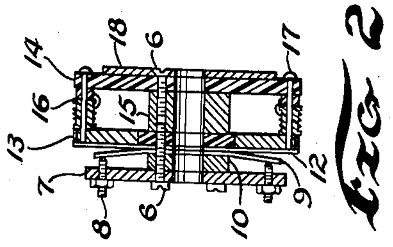
FIGURE 2 is a sectional view of one embodiment of this invention.

The condenser insulating plate 12 is firmly affixed to the condenser plate 13. These plates are normally bonded together and this bonding may be done by any well-known and applicable bonding method. The condenser plate 13 may comprise a printed circuit board. Any of the well-known and successful printed circuit techniques may be used to manufacture this condenser plate 13. The condenser plate 13 includes a plurality of individual copper leaves printed symmetrically on its surface, or as shown in FIGURE 2, may be a copper insert into a phenolic plate. These copper plates are formed in shapes which are similar to the fins of the common condenser plate 9. It is obvious that it is not absolutely necessary for this condenser plate to be made by printed circuit techniques. However, this is the most economical method to manufacture this plate. Each of the individual condenser leaves in the condenser plate 13 has a hole drilled near the outer edge of the leaf to correspond to the position of the adjusting screws on the fins of the common condenser plate 9. The condenser plate 13 is separated from the contact rotor housing by the conductive separation block 15. The contact rotor housing element 14 is made from an insulating material such as Bakelite, and serves as an insulated feedthrough for the conductor elements 17. Between the contact rotor housing 14 and the printed circuit condenser plate 13 is a plurality of tuned coils 16. These tuned coils are held in position by the rotor contact of the contacting elements 17. These contacting elements 17 are also electrically connected to the individual capacitance leaves in the condenser plate 13. The individual coils 16 are electrically connected in parallel with the individual adjustable capacitors by the rotor common plate 18 and the contact elements 17. One lead from the coils 16 is fed, as noted above, through the contact rotor housing to the contact rotor common 18. The other lead from the coils 16 is electrically connected to the individual contacts 17. This common 18 is normally a radio frequency ground but is not at ground potential. The leads from the coils 16 are soldered or otherwise firmly connected to the contact rotor common in the holes which are provided. These connections result in each individual coil being a parallel tuned circuit in combination with its associated capacitance element formed by the leaves of the condenser plates. Each of the coils 16 is tuned to a definite frequency by the capacitance which is in parallel with each coil. The capacitance may be varied in this invention by adjusting the pressure on the leaves on the common condenser plate 9 with the adjusting screws 8. The leaves of the common condenser plate 9 are normally forced away from their associated leaves on the printed circuit condenser plate 13 by their own resiliency. Thus, the adjusting screw members 8, as they are tightened up, straighten out the individual leaves of the condenser common plate 9. As the leaves get closer together, the capacitance of the turret circuit is changed and this changes the resonant frequency of the LC circuit. As the adjusting screws 8 move the individual leaves 9a of the plate 9 closer to the individual leaves of the plate 13, the capacitance between the plates is increased and the resonant frequency of the tuned circuit is lowered. Thus each tuned circuit may be varied as to its tuned frequency. As the entire turret is rotated, a different conductor element 17 makes contact with the external circuitry and supplies to the external circuitry a different resonant frequency for each contact on the turret.

Figure 3:
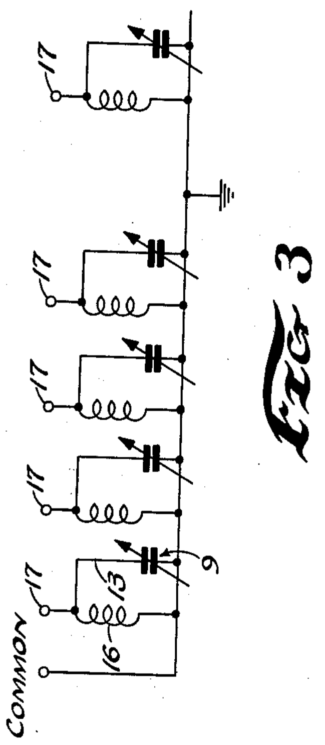
FIGURE 3 is a schematic representation of the equivalent electrical circuit of one embodiment of this invention.

The schematic diagram of FIGURE 3 has been numbered so that the electrical elements are related to the embodiment shown mechanically in FIGURES 1 and 2.

Although this invention has been described with respect to a particular embodiment thereof, it is not to be so limited as changes and modifications may be made therein which are within the full intended scope of the invention as defined by the appended claims.

What is claimed is:

1. A turret tuner including a plurality of capacitors, said capacitors being formed by radial sections of two circular plates, the first of said plates comprising conductive material, the second of said plates comprising a non-conductive material having a plurality of conductive inserts, a plurality of inductors, each of said inductors individually connected to an individual one of said capacitors, a connection plate at a common potential, means for mounting said inductors around the periphery of said second capacitor plate, said mounting means also serving as an individual electrical connection between one side of said capacitors and one side of said inductors, the remaining side of said inductors and said capacitors connected to said connection plate, and means for individually connecting the output signals from said tuned circuit to external means including said mounting means and said common connection plate.

2. A turret tuner including a plurality of capacitors, said capacitors formed from a plurality of plates including a first condenser plate, a dielectric plate, and a second condenser plate, said first condenser plate comprising a plate of conductive material having a plurality of radial fins, said second condenser plate comprising a plate of non-conductive material having a plurality of radial fins of conductive material inserted therein, said condenser plates being axially aligned, means for varying the capacitance between the individual co-operating fins of said condenser plates including an alignment plate having a plurality of holes around its periphery, said holes individually aligned with said first condenser fins and screw means for varying the distance between the co-operating fins of said first condenser plate and said second condenser plate, said screw means being aligned with said fins by said alignment plate, a plurality of inductors, a plurality of mounting means for mounting said inductors about the periphery of said second condenser plate, said inductors individually connected with an individual one of said capacitors to form a tuned circuit, a rotor contact housing for supporting said mounting means and said inductors, a connection plate at a common potential, one side of said inductors and one side of said capacitors connected to said mounting means, and the other side of said inductors and the other side of said capacitors connected to said common plate whereby said mounting means and said common plate comprise an output means for the tuned frequency of each individual tuned circuit.

3. A turret tuner including a plurality of capacitors, said capacitors formed from a plurality of plates including a first condenser plate, a dielectric plate, and a second condenser plate, said first condenser plate comprising a plate of conductive material having a plurality of radial fins, said second condenser plate comprising a plate of non-conductive material having a plurality of radial fins of conductive material inserted therein, said dielectric plate and said condenser plates being axially aligned with the dielectric plate between said condenser plates, said condenser plates being selectively spaced to form a predetermined capacitance with said dielectric plate, means for varying the capacitance between the individual co-operating fins of said condenser plates including an alignment plate having a plurality of holes around its periphery, said holes individually aligned with said first condenser fins and screw means for varying the distance between the co-operating fins of said first condenser plate and said second condenser plate, said screw means being aligned with said fins by said alignment plate, a plurality of inductors, a plurality of mounting means for mounting said inductors about the periphery of said second condenser plate, said inductors individually connected with an individual one of said capacitors to form a tuned circuit, a rotor contact housing for supporting said mounting means and said inductors, a connection plate at a common potential, one side of said inductors and one side of said capacitors connected to said mounting means, and the other side of said inductors and the other side of said capacitors connected to said common plate whereby said mounting means and said common plate comprise an output means for the tuned frequency of each individual tuned circuit.

4. A turret tuner including a plurality of capacitors, said capacitors formed from a plurality of plates including a first condenser plate, a dielectric plate, and a second condenser plate, said first condenser plate comprising a plate of conductive material having a plurality of radial fins, said second condenser plate comprising a plate of non-conductive material having a plurality of radial fins of conductive material inserted therein, said dielectric plate and said condenser plates being axially aligned with the dielectric plate between said condenser plates, said condenser plates being selectively spaced to form a predetermined capacitance with said dielectric plate, means for varying the capacitance between the individual co-operating fins of said condenser plates including an alignment plate having a plurality of holes around its periphery, said holes individually aligned with said first condenser fins and screw means for varying the distance between the co-operating fins of said first condenser plate and said second condenser plate, said screw means being aligned with said fins by said alignment plate, a plurality of inductors, a plurality of mounting means for mounting said inductors about the periphery of said second condenser plate, said mounting means including a contact rotor housing plate with a plurality of holes about its periphery into which said mounting means are inserted, said inductors individually connected with an individual one of said capacitors to form a tuned circuit, said rotor contact housing supporting said mounting means and said inductors, a connection plate at a common potential, one side of said inductors and one side of said capacitors connected to said mounting means, and the other side of said inductors and the other side of said capacitors connected to said common plate whereby said mounting means and said common plate comprise an output means for the tuned frequency of each individual tuned circuit.

5. A turret tuner including a plurality of capacitors, said capacitors formed from a plurality of plates including a first condenser plate, a dielectric plate, and a second condenser plate, said first condenser plate comprising a plate of conductive material having a plurality of radial fins, said second condenser plate comprising a plate of non-conductive material having a plurality of radial fins of conductive material inserted therein, said fins having a hole in their outer periphery, said dielectric plate and said condenser plates being axially aligned with the dielectric plate between said condenser plates, said condenser plates being selectively spaced to form a predetermined capacitance with said dielectric plate, means for varying the capacitance between the individual co-operating fins of said condenser plates including an alignment plate having a plurality of holes around its periphery, said holes individually aligned with said first condenser fins and screw means for varying the distance between the co-operating fins of said first condenser plate and said second condenser plate, said screw means being aligned with said fins by said alignment plate, a plurality of inductors, a plurality of mounting means for mounting said inductors about the periphery of said second condenser plate, a plurality of mounting means comprising a plurality of cylinder rotor contacts having an enlarged head thereon as a contact element for mounting said inductors about the periphery of said second condenser plate and means including a contact rotor housing plate with a plurality of holes about its periphery into which said rotor contacts are inserted, said rotor contacts fitting into said holes in said fins of said second condenser plate, said inductors individually connected with an individual one of said capacitors to form a tuned circuit, a connection plate at a common potential, one side of said inductors and one side of said capacitors connected to said mounting means, and the other side of said inductors and the other side of said capacitors connected to said common plate whereby said mounting means and said common plate comprise an output means for the tuned frequency of each individual tuned circuit.

References Cited in the file of this patent

UNITED STATES PATENTS

| | | |
|---|---|---|
| 1,671,143 | Campbell | May 29, 1928 |
| 2,297,889 | Hoffmann | Oct. 6, 1942 |

| | | |
|---|---|---|
| 2,668,235 | Nordby | Feb. 2, 1954 |
| 2,773,986 | Thias | Dec. 11, 1956 |
| 2,774,880 | Fulmer | Dec. 18, 1956 |
| 2,802,946 | Feigl | Aug. 13, 1957 |

FOREIGN PATENTS

| | | |
|---|---|---|
| 334,996 | Great Britain | Sept. 18, 1930 |
| 338,157 | Italy | Mar. 28, 1936 |